United States Patent [19]

Broadt et al.

[11] 4,326,242

[45] Apr. 20, 1982

[54] MULTILAMP PHOTOFLASH UNIT HAVING SECURED HOUSING

[75] Inventors: David R. Broadt, Lewisburg; Carl F. Kackenmeister; John W. Shaffer, both of Williamsport, all of Pa.

[73] Assignee: GTE Products Corporation, Stamford, Conn.

[21] Appl. No.: 181,938

[22] Filed: Aug. 27, 1980

[51] Int. Cl.³ .............................................. G03B 15/02
[52] U.S. Cl. ...................................... 362/11; 362/15; 362/16
[58] Field of Search ..................... 362/3, 5, 11, 13, 14, 362/15, 16, 185, 189, 196, 198, 200, 213, 240, 278, 310, 320; 206/418, 419, 420, 476; 53/559; 354/143; 431/339

[56] References Cited

U.S. PATENT DOCUMENTS

| | | | |
|---|---|---|---|
| 3,454,756 | 7/1969 | Iwata et al. | 362/13 |
| 3,473,880 | 10/1969 | Wick | 362/13 |
| 3,512,332 | 5/1970 | Klein | 53/559 |
| 3,857,667 | 12/1974 | Vetere et al. | 362/11 |
| 3,920,371 | 11/1975 | Faller | 53/559 |
| 4,104,705 | 8/1978 | Levand, Jr. et al. | 362/13 |

Primary Examiner—Donald P. Walsh
Attorney, Agent, or Firm—Edward J. Coleman

[57] ABSTRACT

A photoflash unit comprising a horizontal linear array of photoflash lamp enclosed within a one-piece housing member having a light-transmitting front portion folded-over a back portion containing a plurality of lamp-receiving cavities in which respective lamps are disposed. The housing is a formed sheet of plastic film having a linear fold disposed horizontally along the top of the array of cavities. A pair of lead-in wires from each of the lamps are connected to conductive circuit patterns on one side of a printed circuit board sandwiched between a set of tabs which run along the bottom of the front and back portions of the housing. The housing tabs are secured together and to the circuit board by a plurality of staples symmetrically disposed along the tabs. Each of the staples has a pair of legs extending through both the housing tabs and the circuit board, with the center region of each staple bearing against an external surface of one of the tabs and the staple legs being clinched onto an external surface of the other of the tabs.

22 Claims, 6 Drawing Figures

MULTILAMP PHOTOFLASH UNIT HAVING SECURED HOUSING

BACKGROUND OF THE INVENTION

This invention relates to multilamp photoflash units and, in particular, to a more compact, cost-efficient array of photoflash lamps, having a secured housing enclosure with enhanced containment strength.

Previous multilamp photoflash units having a horizontally disposed base are represented by the electrically fired four-lamp array referred to as a flashcube, such as described in U.S. Pat. No. 3,327,105, the percussively ignited four-lamp array referred to as a magicube, such as described in U.S. Pat. No. 3,730,669, and the electrically sequenced ten-lamp array referred to as a flash bar, such as described in U.S. Pat. No. 3,857,667. In each of these arrays, the lamps are supported from a generally horizontal plastic base member with the tubular lamp envelopes oriented vertically. Enclosure of the package construction is provided by a transparent plastic cover member having four vertical side walls and a horizontal top wall. A multicavity reflector assembly is disposed about the lamps, and then the transparent cover member is placed over the array of lamps and reflectors and attached to the base member so as to provide an enclosed unit. In the case of the flashcube and flash bar, attachment of the plastic cover to the plastic base member is accomplished by ultrasonically welding the periphery of the cover member about a lip formed along the outer edges of the base member. In the case of the magicube, the preferred method is to employ a high intensity light source to produce heat energy which is absorbed by a darkly colored base member to thereby melt-seal the periphery of the cover member about a lip formed along the outer edges of the base member.

Another type of currently marketed photoflash unit, referred to as a flip flash, comprises a vertically planar array of eight or ten lamps which are ignited by sequentially applied high-voltage firing pulses. The overall construction of the flip flash unit comprises a substantially planar rear housing member and a front housing member in the form of a rectangular concavity, both housing members being formed of a plastic material. Sandwiched between the front and rear housing members, in the order named, are the flashlamps, a multicavity reflector assembly, an insulating sheet, a printed circuit board, and an indicia sheet. According to one embodiment, such as described in U.S. Pat. No. 4,047,015, the front and rear housing members are attached together by interlocking latch means molded in the edges thereof. Use of mechanical latching alone was found to be inadequate for product integrity, as twisting the array or dropping the array several feet onto a hard surface was found to be sufficient to break it open. Accordingly, the seam about the adjoining peripheries of the front and rear housing members is also ultrasonically welded together. In another embodiment of the flip flash array, for example as described in U.S. Pat. No. 4,133,023, the front and rear housing members are joined solely by the welded seam about their peripheries.

According to another embodiment of a planar array of eight flashlamps, for example, as illustrated in German Offenlegungsschrift No. 2629041, published Jan. 27, 1977, the unit has a bathtub-shaped rear housing member and a substantially planar transparent cover member. The planar cover is attached to the rear housing member by two posts projecting from the central portion of the cover in the upper and lower halves thereof, normal to the plane of the cover, which fit into and pass through respective openings in a pair of inwardly protruding bosses in the rear housing member. The ends of the posts projecting through the back of the rear housing are then reshaped with heat to form retaining lugs or rivet heads. The perimeter of the rear housing and planar cover is unsealed except for small mechanical latches at each end provided by the fit of the small cover projections into recesses in the rear housing.

U.S. Pat. No. 4,245,280 describes a more compact, cost-efficient photoflash unit construction which comprises a plurality of electrically ignitable flashlamps disposed in a vertical linear array on a strip-like printed circuit board. The assembly comprising the lamps mounted on the printed circuit strip is located within the longitudinal channel of an elongated housing member having outer flanges with reflector surfaces adjacent to the lamps. A light-transmitting cover panel is mounted to the housing member so as to enclose the flashlamps in the channel. To provide structural rigidity, the cover has rectangular corner posts at each end and a transverse web at the center which engage slots in the housing and are secured by ultrasonic welding. The longitudinal edges are secured by a plurality of cylindrical posts along each side of the cover which fit into matching holes in the housing and have rivet heads formed on the ends as provided by ultrasonic heating and pressure.

In a unidirectional linear photoflash array described in U.S. Pat. No. 3,473,880 of Wick, the lamps are connected to a printed circuit board which comprises the rear housing of the unit and includes reflector cavities. A separate transparent panel of plastic sheet material is then glued or otherwise affixed to the front of the rear housing so as to enclose the lamps.

A copending patent application Ser. No. 181,936, filed concurrently herewith and assigned to the present assignee, describes a compact, cost-efficient photoflash unit comprising a horizontal linear array of flashlamps enclosed within a one-piece housing member having a light-transmitting front portion folded over a back portion containing a plurality of lamp-receiving cavities in which respective lamps are disposed. The housing is a formed sheet of plastic film having a linear fold disposed horizontally along the top of the array of cavities, which are selectively aluminized to provide a reflective coating on the cavity surfaces. A pair of lead-in wires from each of the lamps are connected to conductive circuit patterns on one side of a printed circuit board sandwiched between a set of tabs which run along the bottom of the front and back portions of the housing. The housing tabs are to be secured together so as to retain the printed circuit board therebetween and enclose the lamps within the housing. The fold along the top of the housing provides longitudinal rigidity and enhanced joining strength at the top of the array enclosure; however, at the bottom, the use of prior art closure methods, such as heat, sonic sealing or adhesives, is less than desireable in this application. The tabs at the lower peripheral areas of the folded over plastic film housing are not thermally sealable to the typical phenolic printed circuit board, and adhesives or glue tend to be a messy production material and do not provide the maximized degree of containment strength particularly desireable for photoflash unit enclosures.

SUMMARY OF THE INVENTION

Accordingly, it is an object of the present invention to provide an improved multilamp photoflash unit having a simplified, more cost-efficient construction which is compact and provides significantly improved containment and strength.

A principal object is to provide a multilamp array having a low per unit cost and having an improved housing construction which is comparatively simple, easy to manufacture and of enhanced structural integrity.

These and other objects, advantages and features, are attained in a photoflash unit comprising a one-piece housing member having a light-transmitting front portion folded-over a back portion containing a plurality of lamp-receiving cavities. Each of a plurality of flashlamps are disposed in a respective one of the cavities and enclosed by the folded-over housing member, and a terminal means is joined to the housing member and coupled to the lamps for enabling flashing of the lamps in response to flash actuation signals applied thereto. Means is provided for securing the front portion of the housing to the back portion at peripheral areas thereof which comprises one or more staples, each having a pair of legs extending through both of the housing portions. Each staple has a center region bearing against an external surface of one of the portions, and the staple legs are clinched onto an external surface of the other of the housing portions.

Preferably, the housing member comprises a formed sheet of plastic film with lamp-receiving cavities formed in the back portion and disposed in a horizontal array. A linear fold separates the front and back portions of the housing member and is disposed horizontally along the top thereof. The front and back portions of the folded over housing contain respectively aligned preformed holes, and the staple legs extend through these holes and the region of the terminal means, with the center region of each staple bearing against the external surface of the back portion of the housing and the clinched legs of each of the staples being flattened to be adjacently parallel to the external surface of the front portion of the housing. In this manner a secured enclosure is provided about the lamps by means of a simple, straight forward, mechanical operation, and a high degree of housing containment strength can be obtained by proper choice of staple wire guage size.

According to one embodiment of the invention, the terminal means for the unit comprises a printed circuit board having electrically conductive circuit patterns disposed on a surface thereof which include a plurality of terminal areas at one side edge of the board that are selectively interconnected with the plurality of lamp contact areas. Each of the lamps has a pair of lead-in wires secured in electrical connection with respective ones of the lamp contact areas, and the side edge of the circuit board having the terminal areas extends below the folded-over housing member. The back portion of the plastic housing member includes a first tab means which extends below the lamp-receiving cavities, and the front portion of the housing includes a window area adjacent the lamps and a second tab means which extends below the window area. A portion of the printed circuit board is sandwiched between these first and second tab means and two or more staples are preferably symmetrically disposed along the bottom of the folded-over housing member with the staple legs extending through both housing tabs and the printed circuit board. In this manner the printed circuit board is reliably joined to the housing, and the two housing portions are secured together by means of a comparatively simple mechanical operation. Preferably the staples are oriented to be substantially lengthwise parallel with the bottom periphery of the front portion of the housing. The side portions of the housing can then be secured together by means, for example, such as an adhesive. Hence, the combination of a fold along the top of a one-piece housing unit together with stapling along the bottom periphery of the unit provides a housing enclosure of significantly improved strength and rigidity.

BRIEF DESCRIPTION OF THE DRAWINGS

This invention will be more fully described hereinafter in conjunction with the accompanying drawings, in which.

DESCRIPTION OF PREFERRED EMBODIMENTS

Figure 1:
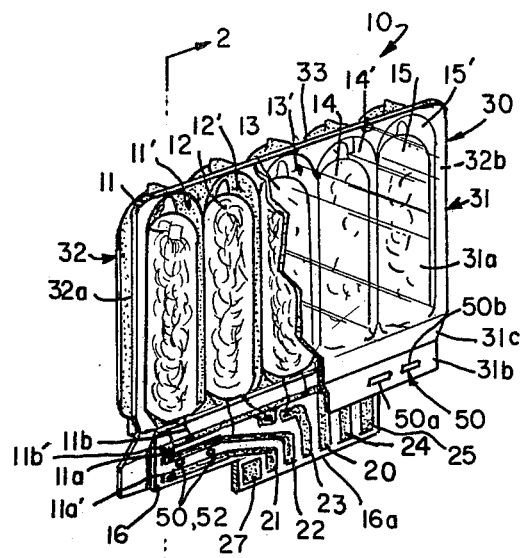
FIG. 1 is a perspective view of one embodiment of a multilamp photoflash unit in accordance with the invention, the view being shown partly broken away in section to more clearly illustrate the construction thereof.
Figure 2:
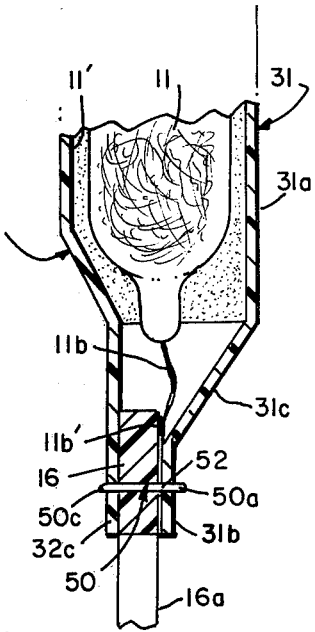
FIG. 2 is an enlarged fragmentary cross-sectional view of the unit of FIG. 1 taken on line 2—2 thereof.

FIGS. 1 and 2 illustrate one embodiment of a multilamp photoflash unit 10 comprising a horizontal array of five flash lamps 11–15 mounted on a printed circuit board 16. Each of the lamps has a pair of lead-in wires 11a, 11b, etc., connected to the printed circuitry on the board 16. For example, the lead-in wires 11a, 11b, etc., may be soldered to respective lamp contact areas 11a', 11b', etc., forming portions of conductive circuit patterns on the circuit board 16 (see FIG. 3). Each of the lamps 11, etc., has a tubular light-transmitting glass envelope having a press seal at one end through which the lead-in wires emerge, and a tip-off at the other end. The exterior of the envelope is coated with a transparent protective material, such as cellulose acetate lacquer, and the interior is filled with a quantity of filamentary combustible material, such as shredded zirconium, and a combustion supporting gas, such as oxygen. The ignition means within the lamp envelope may comprise, in the case of a low voltage source, a filament connected across the inner ends of the lead-in wires with beads of primer material disposed about the junction of the lead-in wires and the filament.

When the flashlamps are mounted and positioned on the circuit board 16, the lead-in wires 11a, 11b, etc., are bent, as illustrated, so that all of the tubular envelopes of the lamps are positioned with the longitudinal axes thereof lying in a plane which is offset from but substantially parallel to the surface of the printed circuit board 16 and arranged in a horizontal array, as illustrated.

Figure 3:
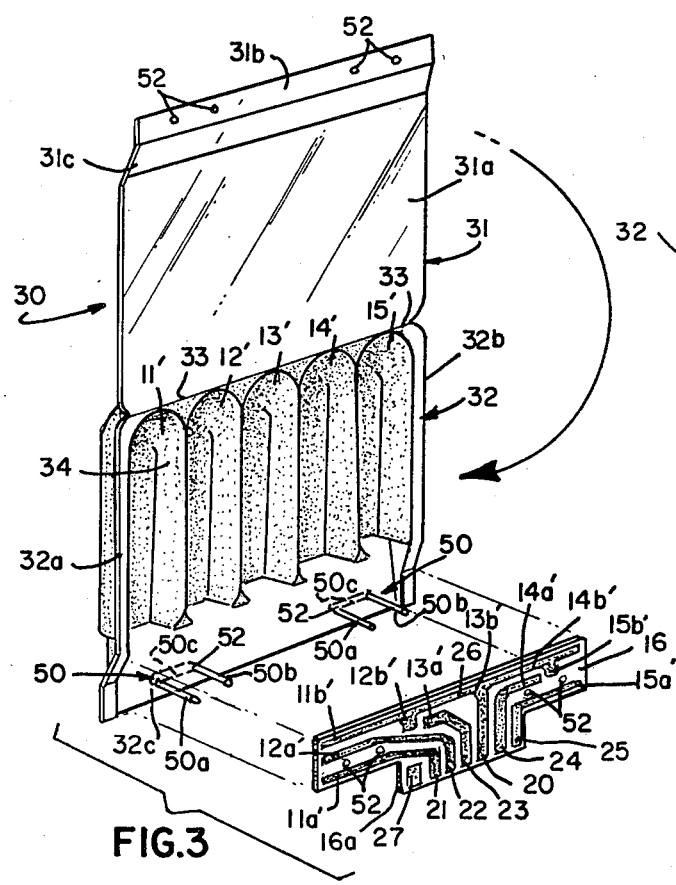
FIG. 3 is a perspective view, in unfolded form, of the one-piece housing of the unit of FIG. 1 in exploded relation to the associated printed circuit board, without attached lamps, and illustrating the relative position of the unclinched staples.

Referring also to FIG. 3, the circuit board 16 has a "printed circuit" thereon for enabling selective flashing of the lamps in response to flash actuation signals in the form of applied firing voltage pulses. In the particular embodiment illustrated in FIGS. 1-3, the entire printed circuit is provided on the same one side of the circuit board, namely, the obverse side of the board to which the flashlamp leads-in wires are connected. The substrate of circuit board 16 comprises an insulating material, such as XP phenolic, and the pattern of electrically conductive circuit runs is provided on the board surface by means such as silk screening, chemical etching, etc. According to a preferred embodiment, however, the circuit patterns are formed of die-stamped copper, thereby providing significant cost advantages. For example, U.S. Pat. No. 3,990,142 describes a die-stamped printed circuit board, and copending application Ser. Nos. 131,614 and 131,711, both filed Mar. 19, 1980 and assigned to the present assignee, describe die-stamped circuit boards for photoflash devices.

The circuit board 16 has a substantially rectangular shape with a projecting tab 16a which is significantly narrower than the long lower side of the circuit board from which the tab projects. Located adjacent to one another on the tab are a plurality of terminal areas 20-25 at one side edge thereof which are selectively interconnected via conductor runs with a plurality of lamp contact areas 11a', 11b' through 15a', 15b'. More specifically, the terminal 20 forms part of and is connected to a common circuit conductor run 26 which is connected electrically to one lead-in wire of each of the flashlamps at lamp contact areas 11b',-15b', respectively. The terminals 21-25 are each directly connected to a respective one of the non-common lead-in wires of a respective one of the lamps. That is, selective terminal 21 is directly connected to the lamp contact area 11a'; selective terminal 22 is directly connected to lamp contact area 12a'; selective terminal 23 is directly connected to lamp contact area 13a'; selective terminal 24 is directly connected to lamp contact area 14a'; and the selective terminal 25 is directly connected to lamp contact area 15a'.

The common terminal 20 and the five selective terminal 21-25 on tab 16a are adapted for engagement with the socket contacts of a source of lamp firing pulses. For example, the source of firing pulses for connection to these terminals may comprise an electronic circuit such as that described in U.S. Pat. No. 3,618,492, which may be incorporated in a camera or a flash attachment for use with the camera and adapted to generate low voltage pulses in synchronization with the actuation of a camera shutter mechanism. Also shown on tab 16a is a conductive strip 27 for bridging camera socket contacts to convert the camera to a flash mode of operation, as described in U.S. Pat. No. 3,757,643.

As described in a copending application Ser. No. 181,936, filed concurrently herewith and assigned to the present assignee, the lamp assembly and a portion of the circuit board are enclosed in a comparatively simple and compact housing construction of a cost-efficient and universal design. More specifically, the unit enclosure comprises a one-piece housing member 30 having a light-transmitting front portion 31 folded over a back portion 32 containing a plurality of, in this case five, lamp-receiving cavities 11'-15', which may have a reflective coating 34. Preferably, the housing member comprises a formed sheet of plastic film, such as cellulose propionate having a thickness of about 30 mils, prepared by injection molding, thermoforming of plastic sheet or film, or any other suitable means. As best shown in the unfolded illustration of FIG. 3, the housing member contains a linear fold 33 which separates the front and back portions, and when the housing is folded over, this linear fold 33 is disposed horizontally along the top of the horizontal array of lamp-receiving cavities 11'-15'.

In order to facilitate securing of the housing once it is folded over, the back portion 32 is provided with side flanges 32a and 32b, which extend on each side of the array of cavities, and an elongated tab 32c (FIG. 3) which extends below the array of cavities. The front portion 31 of the housing includes a transparent window area 31a, which is substantially planar, and an elongated tab 31b which extends below the window area and it is disposed in a plane which is substantially parallel to but offset from the plane of the window area. The front portion 31 further includes a web 31c which joins window area 31a with the tab 31b.

In assembly of the unit, the lead-in wires of the flashlamps are soldered to the appropriate lamp contact areas on the printed circuit board 16, and then the circuit board is aligned against tab 32c of the housing, with each of the lamps 11-15 disposed in a respective one of the cavities 11'-15'. The front portion of the housing is then folded over, with the circuit board 16 sandwiched between tabs 31b and 32c and the window area 31a enclosing the lamps in their respective cavities. In this manner, the window area is essentially adjacent to the lamps and the top and side peripheries of the lamp receiving cavities are substantially in abutment with the window area of the folded over front portion so that individual chambers enclose each of the lamps. The bottom of each such chamber has an opening, as illustrated, through which each pair of lamp lead-in wires pass through to their electrical connection areas on the circuit board. In this manner, as is best illustrated in FIG. 2, the housing web 31c encloses the lamp lead-in wires and the contact areas on the circuit board to which the wires are connected.

In accordance with the present invention, the folded-over front housing portion 31 is securely attached to the back portion 32 in the following manner in order to provide improved structural closure strength while retaining the objectives of compactness, cost-efficiency, and ease and convenience of manufacture. Referring to FIGS. 1-3, a pair of symmetrically disposed wire staples 50 are inserted through respectively aligned preformed holes 52 in the bottom tabs 32c and 31b and the circuit board 16. Preferably, the staples are inserted from the back side of the housing and crimped over, or clinched, onto the front side of the housing. More specifically, each of the staples has a pair of legs 50a and 50b which extend through the aligned holes 52 in the housing tabs and circuit board. Each staple further includes a center region 50c which is positioned to bear against the external surface of the back portion tab 32c. The staple legs 50a and 50b are clinched onto the external surface of the front portion tab 31b so as to secure the symmetrically disposed staples at the bottom peripheral areas of the housing. In this manner, the housing tabs 32c and 31b are firmly secured together with the printed circuit board sandwiched and secured therebetween.

In the preferred embodiment illustrated, the staple legs 50a and 50b are shown bent inwardly toward each other, and the symmetrically disposed staples are oriented to be substantially lengthwise parallel with the bottom periphery of the front portion tab 31b of the folded-over housing member. Preferably, the clinched legs of each of the staples are flattened to be adjacently parallel to the surface onto which the legs are clinched, thereby providing a neater, less obtrusive appearance. In order to avoid any possible interference with the operating circuitry on the circuit board, the holes 52 in the circuit board, and thus the staple legs extending therethrough, are spaced away from the conductive circuit patterns 11a', 12a', etc., as illustrated in FIGS. 1 and 3.

Each wire staple 50 can be installed as previously stated, or it can be force-driven through the housing tabs and the circuit board, if the board is made of a suitable material. In one specific implementation, the wire used to form the staple was 0.032 inch diameter galvenized iron. In a preferred embodiment, a flat wire is used having a generally rectangular cross section of approximately 0.021 inch × 0.032 inch and an overall length of 0.930 inch. When formed into a staple shape, the dimension of the center region was about 0.430 inch and each of the legs had a length of about 0.250 inch.

In order to provide complete securing of the housing enclosure, the sides of the housing may also be sealed together by use of adhesive. More specifically, the back housing side flanges 32a and 32b align with the side portions of the front window area 31a such that an adhesive or other securing means may be disposed therebetween. As illustrated, the side flanges 32a and 32b may extend from the top to the bottom of the back portion of the unit, following the offset between the front periphery of the cavities and tab 32c, and thereby align with each full side of the front portion of the housing. That is, flanges 32a and 32b align with respective sides of the window area 31a, the web 31c, and the tab 31b.

In order to facilitate engagement of the terminal areas 20–25 with the socket contacts of a source of lamp firing pulses, such as a camera or flash attachment, the projecting tab 16a of the circuit board extends below and exteriorly of the secured housing enclosure, as shown in FIGS. 1 and 2, to expose these terminal areas.

The flash actuating circuitry functions as follows upon the terminals 20–25 being connected to a source of firing pulses, such as, for example, described in the aforementioned U.S. Pat. Nos. 3,618,492 and 3,757,643. Assuming that none of the lamps have been flashed, upon occurrence of a first firing pulse across terminals 20 and 21, this pulse will be directly applied to the lead-in wires of the first connected flashlamp 11, whereupon the lamp 11 flashes and becomes an open circuit between its lead-in wires 11a and 11b. In the electronic circuit described in the aforementioned U.S. Pat. No. 3,618,492, a monitoring function is provided wherein a current of limited predetermined maximum value is applied through each unexpended flashlamp. This monitoring current is generated prior to the ignition of a given one of the flashlamps. In this manner, alignment signals are derived which function to align the flashlamp sequencing circuit to bypass inoperative flashlamps. This monitoring function is dependent upon the resistance across the lamp lead-in wires. Thus, if the monitoring circuit senses a significantly higher resistance across the lamp lead-in wires, say for example, higher than 50 ohms, the selective terminal connected to that lamp will be bypassed, and the firing pulse will be applied across the operative lamp connected to the next successive selective terminal. On the other hand, if the monitoring circuit senses a resistance below the preselected level (that is below about 50 ohms) a firing pulse will be applied to the selective terminal connected to that lamp.

In the present instance, with the first lamp 11 having been fired, the monitoring circuit will cause the firing pulse alignment to bypass terminal 21 and proceed to terminal 22, to which the unexpended lamp 12 is directly connected. Hence, when the next firing pulse occurs, it is applied directly to the second lamp 12, thereby firing that lamp. In like manner the third firing pulse is applied via terminals 20 and 23 to fire lamp 13. The fourth firing pulse is applied via terminals 20 and 24 to fire lamp 14 and the fifth firing pulse applied via terminals 20 and 25 to fire lamp 15. As each lamp flashes, the reflective metalized coating 34 causes the flash illumination to be directed in front of the array.

Figure 4:
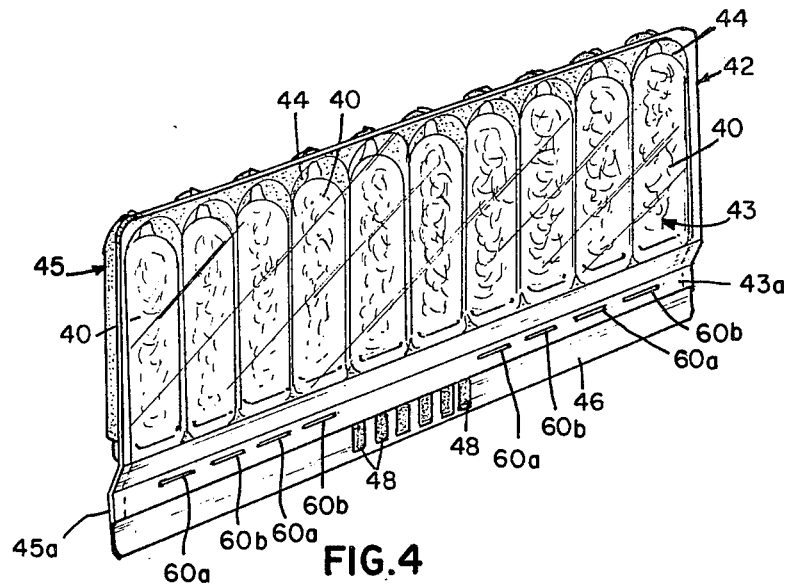
FIG. 4 is a perspective view of another embodiment of a multilamp photoflash unit in accordance with the invention.
Figure 5:
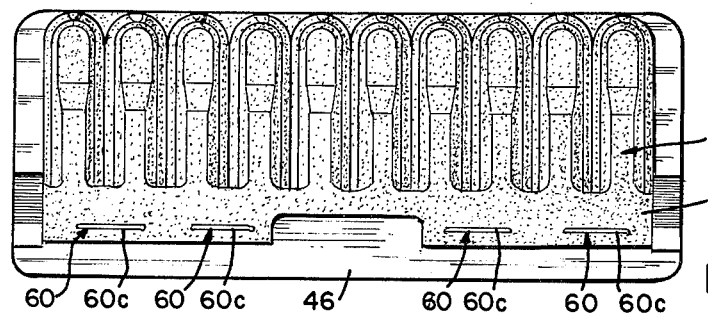
FIG. 5 is a rear elevational view of the unit of FIG. 4.
Figure 6:
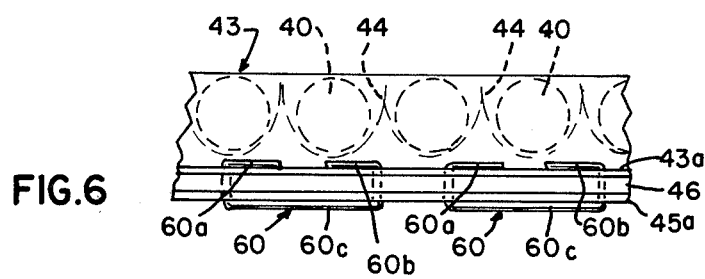
FIG. 6 is a fragmentary bottom view of a portion of the unit of FIG. 4.

Although the described embodiments have referred to the use of five lamps in a horizontal linear array which is unidirectional and employs a relatively narrow connecting tab, it is contemplated that the construction may be applied to an array of two or more lamps which may be disposed for bidirectional applications in an arrangement that is other than linear and employs a connecting tab which is as wide as or wider than the printed circuit board. Thus, for example, FIGS. 4–6 illustrate a specific alternative embodiment which employs ten lamps 40 disposed in a horizontal linear array in a one-piece housing 42 having a front portion 43 and a back portion 45 with reflector cavities 44 facing unidirectionally. Other than for employing ten cavities and having somewhat different overall dimensions, the housing 42 is essentially the same as the housing 30 described with respect to FIGS. 1-3. The photoflash unit of FIGS. 4–6 employs a printed circuit board having a projecting tab 46 which is actually wider than the main portion of the circuit board. The circuit board is sandwiched between tabs 43a and 45a along the bottom peripheries of the folded-over front and back housing portions, respectively. Disposed on the circuit board tab 46 are a plurality of conductive terminal areas 48 which extend below and exteriorly of the secured housing enclosure. If, as illustrated, five selective terminals and a common terminal are employed to control the firing of ten lamps, selective switching circuitry may be employed for respective lamp pairs, as described in copending applications Ser. Nos. 156,983 and 156,991, both filed June 6, 1980 and assigned to the present assignee. The lamps are assembled to the circuit board, and the circuit board is enclosed and secured within the housing 42, in the same manner described with respect to the embodiment of FIGS. 1-3. In this instance, however, four staples 60 are symmetrically disposed along the bottom periphery of the housing, with the respective center regions 60c bearing against the exterior surface of back tab 45a, and with each pair of staple legs 60a, 60b extending through tabs 43a and 45a and the circuit board and being clinched flat against the exterior surface of front tab 43a. Again, the four staples are arranged lengthwise parallel with the bottom periphery of tab 43a, thereby providing a neat secure attachment along the bottom of this much wider folded-over housing configuration in combination with a wider circuit board tab.

We have found that the use of a single formed part, namely, housing 30 or 42, in which the front portion including a window area is folded over the back portion including the reflector cavities, in combination with staple closure of the bottom periphery of the housing provides significant advantages. The presence of the fold and staple closure improves the longitudinal rigidity of the package. It has also been found that the strength of the housing is significantly improved through the use of a fold at the top, rather than a butt seal, or the like, and staple closure along the bottom periphery rather than adhesive. Accordingly, the housing provides significantly improved containment for the enclosed flashlamps. Further, with respect to the manufacturing process, the use of staples provides a simple straight forward, mechanical operation.

Hence, although the invention has been described with respect to a specific embodiment, it will be appreciated that modifications and changes may be made by those skilled in the art without departing from the true spirit and scope of the invention. For example, the housing 30 may be formed of materials other than cellulose propionate, such as other thermoplastic films; the circuit board may be formed of a material other than phenolic, such as enamel coated steel or polystyrene, and may be an integral part of the housing; and conductive materials other than copper may be employed for providing the circuit patterns. Of course, if the circuitry is integral with the housing, such as, for example, by disposing the conductive circuit patterns directly on tab 32c of the back housing portion, then the staple would extend through only the two bottom housing tabs and be spaced apart from the conductor runs. Although the staples have been shown as symmetrically disposed along the housing periphery, there are applications wherein asymmetric staple locations are desirable. It is also clear, that the staple legs may be bent outwardly away from each other, rather than inward; the staple legs may be bent in nonalignment with the staple center region 50c; one or more staples may be employed; and the staples may be driven or inserted from front to back, with the center region bearing against the exterior surface of say tab 31b, rather than from back to front as illustrated.

We claim:

1. A multilamp photoflash unit comprising, in combination, a one-piece housing member having a light-transmitting front portion folded-over a back portion containing a plurality of lamp-receiving cavities, a plurality of flashlamps each disposed in a respective one of said cavities and enclosed by said folded-over housing member, terminal means joined to said housing member and coupled to said lamps for enabling flashing of the lamps in response to flash actuation signals applied to said terminal means, and means securing said front portion to said back portion at peripheral areas thereof comprising one or more staples, each of said staples having a pair of legs extending through both of said housing portions and having a center region bearing against an external surface of one of said portions, said legs being clinched onto an external surface of the other of said portions.

2. The photoflash unit of claim 1 wherein said front and back portions of the folded-over housing member contain respectively aligned preformed holes through which said staple legs extend.

3. The photoflash unit of claim 1 wherein the center region of each of said staples bears against an external surface of the back portion of said housing member.

4. The photoflash unit of claim 1 wherein the clinched legs of each of said staples are flattened to be adjacently parallel to the surface onto which said legs are clinched.

5. The photoflash unit of claim 1 wherein said housing member contains a linear fold separating said front and back portions and disposed horizontally along the top of said housing member, and said one or more staples are disposed along the bottom of said folded over housing member, thereby providing a secured enclosure about said lamps.

6. The photoflash unit of claim 5 wherein each of said pairs of staple legs extend through the region of said terminal means, each of said lamps has a pair of lead-in wires secured in electrical connection with respective portions of said terminal means within said secured enclosure, and said terminal means extends below and exteriorly of said secured enclosure.

7. The photoflash unit of claim 6 wherein said front and back portions of the folded-over housing member contain respectively aligned preformed holes through which said staple legs extend.

8. The photoflash unit of claim 6 wherein the center region of each of said staples bears against an external surface of the back portion of said housing member.

9. The photoflash unit of claim 8 wherein the clinched legs of each of said staples are flattened to be adjacently parallel to the external surface of the front portion of said housing onto which said legs are clinched.

10. The photoflash unit of claim 6 wherein said housing member comprises a formed sheet of plastic film with said lamp receiving cavities formed in said back portion.

11. The photoflash unit of claim 6 wherein said securing means comprises two or more staples symmetrically disposed along the bottom of said folded-over housing member and oriented to be substantially lengthwise parallel with the bottom periphery of the front portion of said folded-over housing member.

12. The photoflash unit of claim 1 wherein said terminal means comprises a printed circuit board having electrically conductive circuit patterns disposed on a surface thereof, said circuit patterns including a plurality of terminal areas at one side edge of said circuit board that are selectively interconnected with a plurality of lamp contact areas, each of said lamps has a pair of lead-in wires secured in electrical connection with respective ones of said lamp contact areas, said side edge of the circuit board having said terminal areas extends below said folded-over housing member, and each of said pairs of staple legs extend through said printed circuit board.

13. The photoflash unit of claim 12 wherein said housing member contains a linear fold separating said front and back portions and disposed horizontally along the top of said housing member, said back portion of the housing member includes a first tab means extending below said cavities, said front portion of the housing member includes a window area adjacent said lamps and a second tab means extending below said window area, said circuit board has a projecting tab at said one side edge with said terminal areas located adjacent one another on said circuit board tab, and said one or more staples are disposed along the first and second tab means of said folded over housing member, thereby providing a secured enclosure about said lamps, a portion of said circuit board being sandwiched between said first and second tab means of the housing member, and secured thereto by said one or more staples, with said circuit board tab extending below and exteriorly of said secured enclosure.

14. The photoflash unit of claim 13 wherein said printed circuit board and said first and second tab means of the folded-over housing member contain respectively aligned preformed holes through which said staple legs extend.

15. The photoflash unit of claim 13 wherein said lamp lead-in wires and lamp contact areas are disposed within said secured enclosure, said window area and second tab means of the front portion of the housing member are disposed in substantially parallel planes offset from one another, and said front portion further includes a web joining said window area and second tab means, said web enclosing said lead-in wires.

16. The photoflash unit of claim 13 wherein the center region of each of said staples bears against an external surface of said first tab means of the housing member.

17. The photoflash unit of claim 16 wherein the clinched legs of each of said staples are flattened to be adjacently parallel to the external surface of said second tab means of the housing member onto which said legs are clinched.

18. The photoflash unit of claim 16 wherein all of said terminal areas and said lamp contact areas connected to said lead-in wires are disposed on the same one side of said circuit board facing said second tab means of the housing member.

19. The photoflash unit of claim 13 wherein said housing member comprises a formed sheet of plastic film with said lamp receiving cavities and first tab means being formed in said back portion and with said window area and second tab means being formed in said front portion.

20. The photoflash unit of claim 13 wherein said securing means comprises two or more staples symmetrically disposed along that first and second tab means of said folded-over housing member and oriented to be substantially lengthwise parallel with the bottom peripheries of the first and second tab means of said folded-over housing member.

21. The photoflash unit of claim 13 wherein said staple legs extending through said printed circuit board are spaced away from the conductive circuit patterns on said board.

22. The photoflash unit of claim 1 wherein said housing member comprises a formed sheet of plastic film with said lamp-receiving cavities formed in said back portion in a horizontal linear array and with a linear fold disposed horizontally along the top of said array of cavities and separating said front and back portions, said terminal means comprises a printed circuit board having electrically conductive patterns disposed on a surface thereof, said circuit patterns including a plurality of terminal areas at one side edge of said circuit board that are selectively interconnected with a plurality of lamp contact areas, each of said lamps has a pair of lead-in wires secured in electrical connection with respective ones of said lamp contact areas, said side edge of the circuit board having said terminal areas extends below said folded-over housing member, said one or more staples are disposed along the bottom of said folded-over housing member with each of said pair of staple legs extending through said printed circuit board, and further including means sealing together the sides of said folded-over housing member, thereby providing a secured enclosure about said lamps.

* * * * *